United States Patent [19]
Komatsu et al.

[11] Patent Number: 5,521,123
[45] Date of Patent: May 28, 1996

[54] INFRARED SENSOR AND METHOD FOR PRODUCTION THEREOF

[75] Inventors: Kiyoshi Komatsu; Takehisa Mori; Atsushi Sone, all of Ashigarakami; Mitsuteru Kimura, Miyagi, all of Japan

[73] Assignee: Terumo Kabushiki Kaisha, Tokyo, Japan

[21] Appl. No.: 365,036

[22] Filed: Dec. 28, 1994

Related U.S. Application Data

[62] Division of Ser. No. 47,472, Apr. 19, 1993, Pat. No. 5,397,897.

[30] Foreign Application Priority Data

| Apr. 17, 1992 | [JP] | Japan | 4-97693 |
| Apr. 30, 1992 | [JP] | Japan | 4-111914 |
| May 22, 1992 | [JP] | Japan | 4-130616 |
| May 22, 1992 | [JP] | Japan | 4-130617 |
| Nov. 20, 1992 | [JP] | Japan | 4-311709 |

[51] Int. Cl.$^6$ ............................ H01L 21/60
[52] U.S. Cl. ............................ 437/209
[58] Field of Search .................. 437/3, 4, 5, 7, 437/8, 209, 211, 214, 215, 219

[56] References Cited

U.S. PATENT DOCUMENTS

| 4,023,562 | 5/1977 | Hynecek et al. | 437/215 |
| 4,472,239 | 9/1984 | Johnson et al. | 437/7 |
| 4,618,397 | 10/1986 | Shimizu et al. | 437/7 |
| 5,051,379 | 9/1991 | Bayer et al. | 437/8 |
| 5,106,784 | 4/1992 | Bednarz | 437/215 |
| 5,188,983 | 2/1993 | Guckel et al. | 437/215 |
| 5,242,863 | 9/1993 | Xiang-Zheng et al. | 437/7 |

FOREIGN PATENT DOCUMENTS

| 0453372 | 10/1991 | European Pat. Off. . |  |
| 0523716 | 1/1993 | European Pat. Off. . |  |
| 3536133 | 4/1987 | Germany . |  |
| 63-187128 | 8/1988 | Japan | 374/121 |
| 1-174918 | 7/1989 | Japan | 250/338.3 |
| 2-210230 | 8/1990 | Japan . |  |
| 2-205730 | 8/1990 | Japan | 250/338.4 |
| 2-205729 | 8/1990 | Japan | 250/338.4 |
| 3-136379 | 6/1991 | Japan . |  |
| 3-192774 | 8/1991 | Japan . |  |
| 3-192773 | 8/1991 | Japan . |  |
| 3-210437 | 9/1991 | Japan | 250/338.1 |

*Primary Examiner*—Tom Thomas
*Assistant Examiner*—Kevin M. Picardat
*Attorney, Agent, or Firm*—Burns, Doane, Swecker & Mathis

[57] ABSTRACT

The disclosed infrared sensor comprises a substrate provided with a bridging part and a sensing part made of an infrared temperature-sensitive film formed on the bridging part. A first lid member covers the sensing part and bridging part and a second lid member covers the reverse surface of the substrate and tightly seals a cavity formed between the substrate and the bridging part. The invention preferably comprises an electrode pad electrically connected to the infrared temperature sensitive film and formed of a laminate film including an etchant-resistant electrically conductive film. The invention provides an infrared sensor with a small stable bridging structure which allows easy formation of a contact hole on an electrode pad without causing a breakage of the bridging part. A method for the production of an infrared sensor is also disclosed.

13 Claims, 9 Drawing Sheets

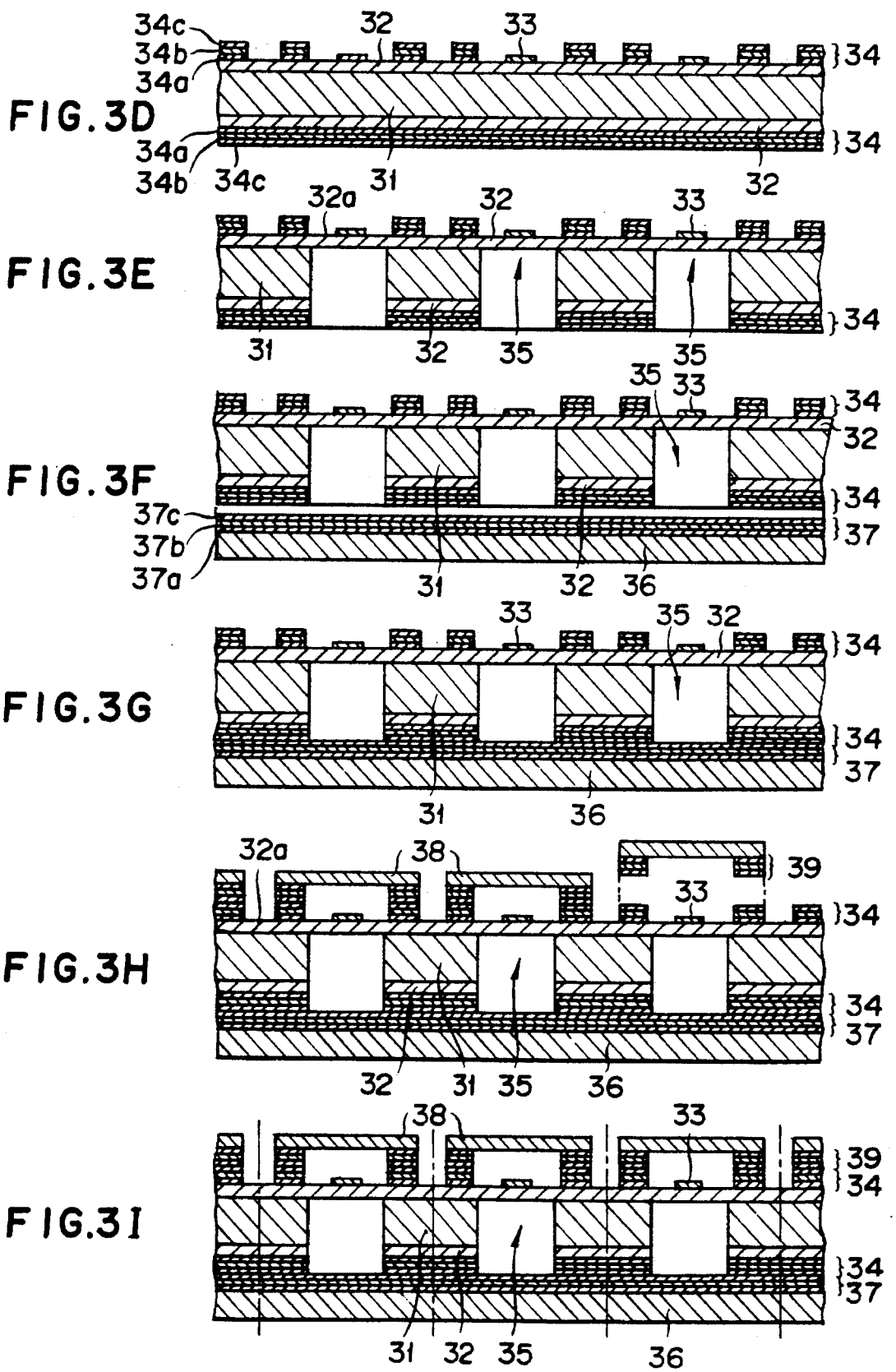

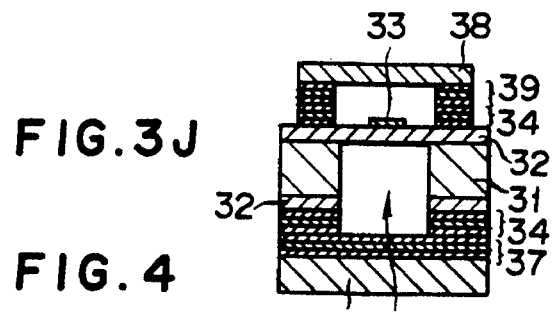
FIG. 3J
FIG. 4
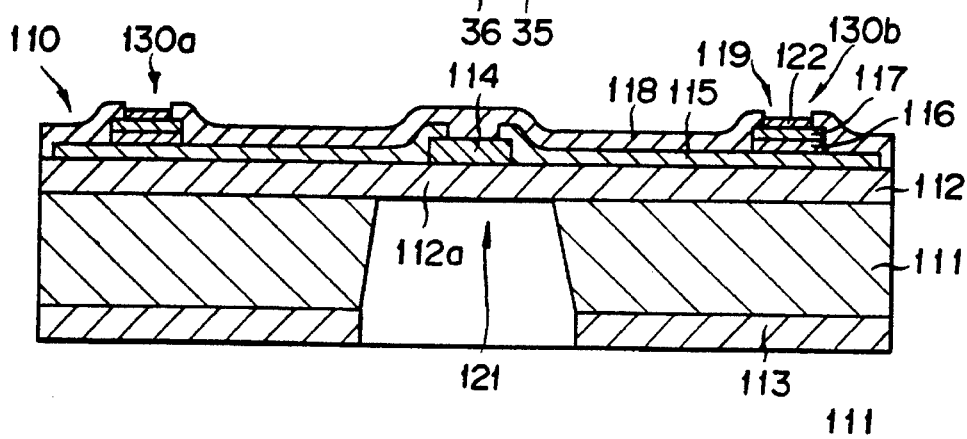
FIG. 5A
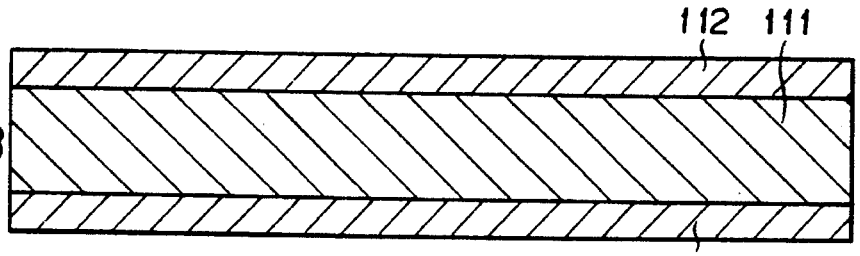
FIG. 5B
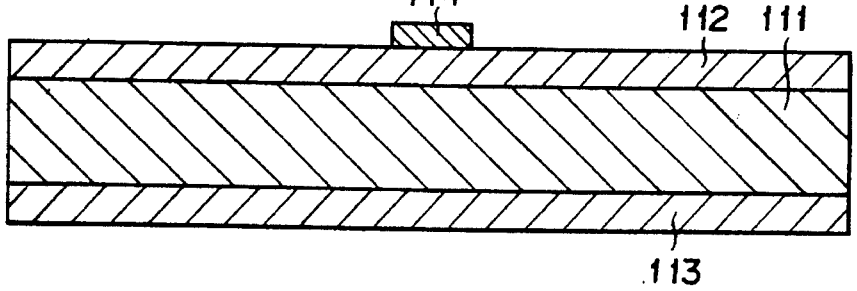
FIG. 5C

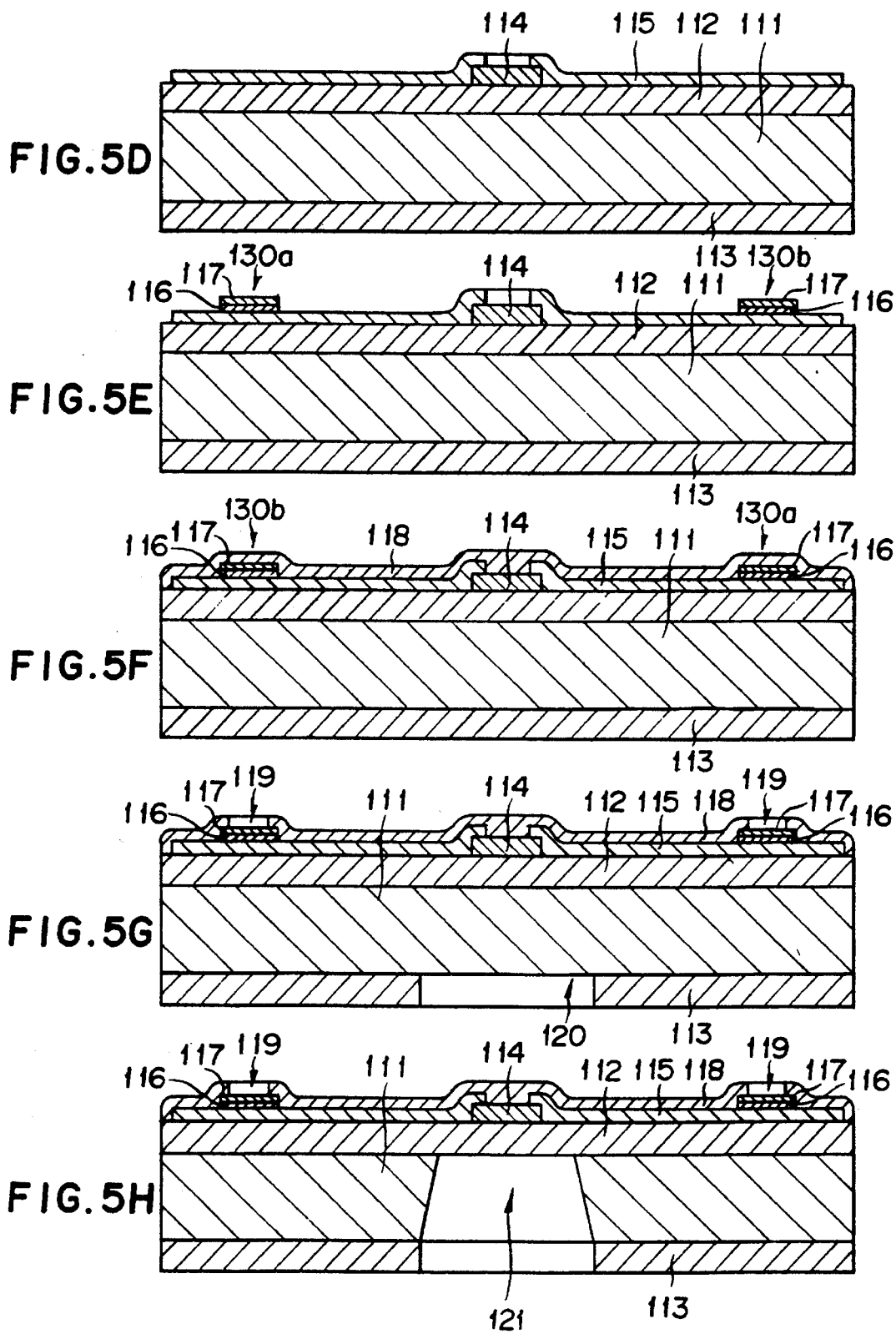

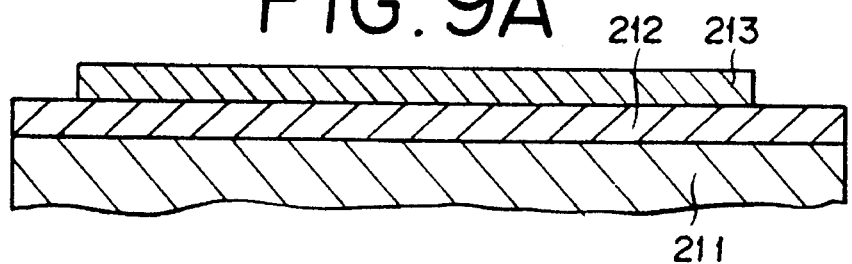
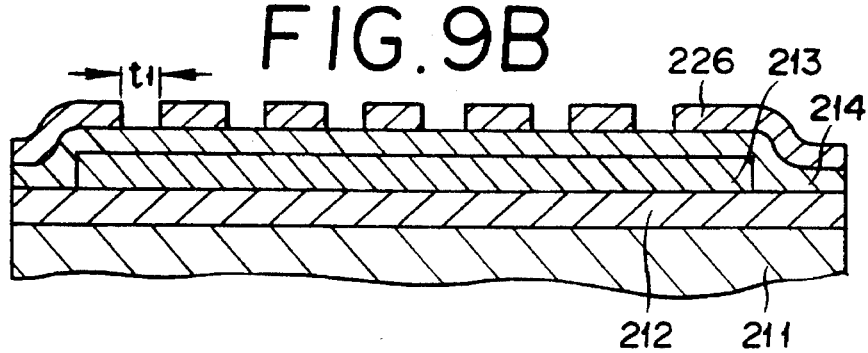
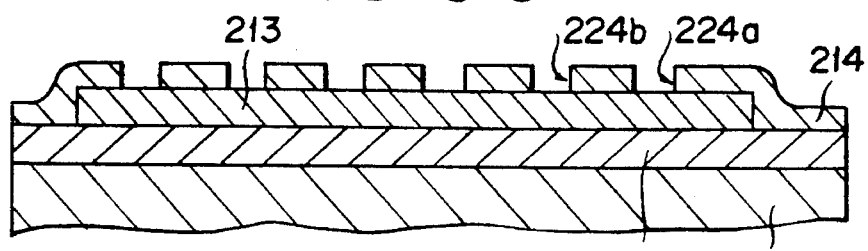
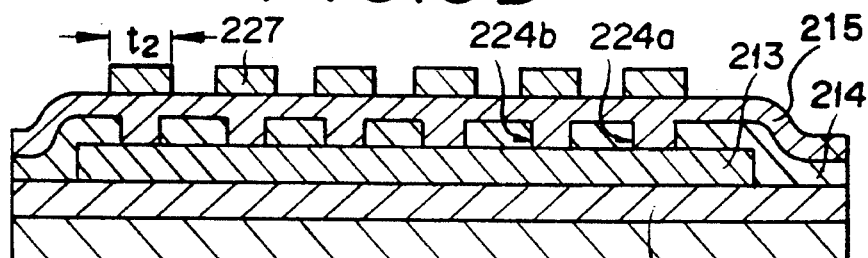
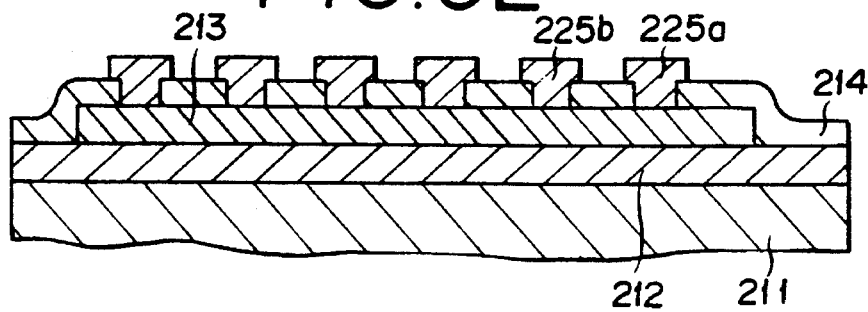

INFRARED SENSOR AND METHOD FOR PRODUCTION THEREOF

This application is a divisional of Application Ser. No. 08/047,472, filed Apr. 19, 1993 now U.S. Pat. No. 5,397,897.

BACKGROUND OF THE INVENTION

1. Field of the Invention

This invention relates to an infrared sensor for the non-contact measurement of the temperature of a given object and a method for the production thereof. More particularly, it relates to an infrared sensor provided on an infrared temperature-sensing film with an electrode and a method for the production thereof.

2. Description of the Prior Art

Recently, various techniques have been developed for the production of infrared sensors usable ideally for non-contact thermometers, fop example, by effective use of the technique of microfine fabrication of semiconductors. The infrared sensors come in various types such as for example, those of the thermobolometer type and the thermopile type. The infrared sensors of the thermobolometer type are superior to those of other types in allowing easy dimensional reduction because of the fact that their sensitive film which is made of a substance fulfilling the function of a thermistor, is capable of measuring an increase in temperature caused by the incidence of infrared radiation by measuring a change in the magnitude of electrical resistance and consequently determining the amount of the infrared radiation.

In the infrared sensor of the thermobolometer type, if the infrared temperature-sensitive film of the sensor has a small heat capacity, the amount of heat transmitted outwardly from the film decreases, the temperature rises remarkably and the response of the sensor to a minute amount of infrared radiation gains in sensitivity in proportion. The conventional infrared sensor of the thermobolometer type, therefore, has been constructed so that an extremely small bridging part is formed on a supporting substrate made of a semiconducting material and an infrared sensitive film is formed on the bridging part by the microfine fabrication technique. To be specific, the bridging structure keeps a temperature-sensing part of the sensor afloat from the supporting substrate for the purpose of improving the response sensitivity of the sensor.

The infrared sensor requires various contrivances for the sake of measurement because it is intended to handle a very minute amount of infrared radiation emitted from a given object. For example, one infrared sensor is provided with two entirely identical infrared temperature-sensitive films having bridging structures; one of the films is exposed to the incidence of infrared radiation and the other shielded from the infrared radiation. By constantly comparing the output of the infrared temperature-sensitive film exposed to the infrared radiation and the output of the infrared temperature-sensitive film shielded from the infrared radiation, the infrared sensor is enabled to exclude the electrical noise and thermal disturbance and detect the net amount of infrared radiation.

The infrared sensor of this type is furnished with various contrivances so as to ensure an efficient incidence of infrared radiation on the exposed infrared sensitive film. From the practical point of view, however, the infrared sensor requires the minute bridging structure formed therein to be protected mechanically and physically. Heretofore, for the protection of the bridging structure, the practice of keeping the infrared sensor device in such a container as a can has been commonly used.

The conventional infrared sensor has the sensor element thereof kept in a container as described above. When the sensor accommodated in the container as described above is used as a non-contact thermometer, it poses problems in relation to thermal conductivity, restriction in size, and cost of production. Thus, there is a need for a packaging method which allows the sensor element to be protected as required by a simple procedure at a low cost.

In the infrared sensor of this kind, for the purpose of ensuring selective incidence of the infrared radiation on one of the pair of infrared temperature-sensitive films, the sensor element is required to have on the front side thereof, a lid as means for effecting the selective incidence of infrared radiation. In the meantime, the sensor element generally has on the reverse side thereof an opening of desired shape and size formed during the fabrication of the bridging structure so as to allow anisotropic etching such as, with an aqueous hydrazine solution. This opening is likewise preferably sealed with a lid to diminish the otherwise inevitable effect of reflection and absorption of infrared radiation through the opening.

To cope with the situation, the following measure has been conceived. Some hundreds of sensor elements are simultaneously incised in one silicon wafer and the sensor elements still held on the wafer are tested for electrical properties as with a probe to discriminat between conforming and non-conforming articles. Thereafter, the sensor elements are severally cut off the wafer with a dicing saw. Each of the separated sensor elements is then washed, with a lid joined to the front side (the side for admitting the incident infrared radiation) thereof and another lid joined to the rear side thereof.

This method, however has the following problems. For example, at the step of cutting the silicon wafer with the dicing saw, the practice of feeding cooling water to the dicing saw for the purpose of removing the heat generated between the chip and the rotary blade, lubricating the dicing saw, and ensuring chip ejection is prevalent. This cooling water causes breakage of the bridging structure. In this case, the breakage of the bridging structure can be precluded by precoating the chip with electron wax. Since the chip must be subsequently cleaned of this wax as by washing, the impact of this washing brings about breakage of the bridging structure.

In the conventional infrared sensor, the possible loss of the energy of the infrared radiation impinging on the infrared temperature-sensitive film is avoided by having this infrared temperature-sensitive film formed on the minute bridging structure as described above. Since the energy of the infrared radiation impinging on the infrared temperature-sensitive film is lost through the air which envelopes the infrared temperature-sensitive film, the problem arises that an infrared sensor which excels in practical utility and possesses high sensitivity cannot be obtained simply by imparting a bridging structure to the infrared temperature-sensitive film.

Two methods are available for the formation of the bridging structure. One of them comprises the steps of forming an excavated part in a sensor substrate, temporarily refilling the excavated part thereby forming a sacrificial layer, forming on this sacrificial layer a pattern for the bridging structure, forming an infrared temperature-sensitive film on the pattern, and then removing the sacrificial layer while leaving the formed bridging part behind. The other method comprises the steps of forming on one surface of a sensor substrate a pattern for a bridging part and an infrared temperature-sensitive film and performing an anisotropic etching on the other surface of the sensor substrate thereby forming a cavity below the bridging pattern and completing the bridging structure. The latter method is easier procedurally than the former method.

Incidentally, in the latter method, hydrazine or an aqueous potassium hydroxide solution is used to effect the anisotropic etching. Since this etchant is strongly alkaline, it dissolves not only the silicon as the material for the sensor substrate but also materials other than silicon such as, for example, aluminum which is generally used as the material for electrodes and conductors. Thus, the manufacture of the bridging structure needs to resort to the following method, for example.

This method comprises the steps of forming an insulating film intended to form a bridging part on a silicon substrate destined to form a sensor substrate, superposing an infrared temperature-sensitive film on the insulating film, forming thereon a wiring layer and an electrode pad both of aluminum, coating the entire surface with a protective film (insulating film), then carrying out the anisotropic etching selectively on the rear surface of the silicon substrate thereby forming a bridging part, subsequently boring a contact hole in the protective film on the upper surface of the silicon substrate to a depth reaching the electrode pad, and electrically connecting the electrode pad and a flexible printed substrate (FPC) by soldering through the medium of the contact hole.

An object of this invention, therefore, is to provide an infrared sensor which is furnished with a stable bridging structure and is small and inexpensive and a method for the production thereof.

Another object of this invention is to provide a method for the production of an infrared sensor which allows easy formation of a contact hole on an electrode pad without involving breakage of a bridging part.

A further object of this invention is to provide an infrared sensor such that during the process of etching for the formation of electrodes, the phenomenon of side etching if allowed to occur will produce no gap between electrodes and an insulating film or no dispersion in the magnitude of electrical resistance of an infrared temperature-sensitive film.

Yet another object of this invention is to provide an infrared sensor of high-sensitivity which enables the amount of energy lost through the periphery of the infrared temperature-sensitive film to be minimized.

SUMMARY OF THE INVENTION

The objects mentioned above are accomplished by an infrared sensor which comprises a substrate provided with a bridging part, a sensing part made of an infrared temperature-sensitive film formed in the bridging part, a first lid member covering the sensing part and the bridging part, and a second lid member covering the reverse surface of the substrate and tightly sealing a cavity formed between the substrate and the bridging part.

This invention contemplates the infrared sensor mentioned above in a construction such that it further comprises an electrode pad electrically connected to the infrared temperature-sensitive film and formed of a laminate film including an etchant-resistant electrically conductive film. This invention also contemplates the infrared sensor mentioned above in a construction such that it further comprises an infrared temperature-sensitive film formed through the medium of a first insulating film on the substrate, a second insulating film formed on the infrared temperature-sensitive film and provided therein with a contact hole deep enough to reach the infrared temperature-sensitive film, and an electrode formed on the second insulating film, electrically connected to the infrared temperature-sensitive film through the medium of the contact hole, and furnished on the second insulating film with a part having a width greater than the width of the part inside the contact hole.

The objects described above are accomplished by a method for the production of an infrared sensor which comprises a step of forming on a semiconductor wafer a plurality of sensor elements provided on a bridging part with an infrared temperature-sensitive film, a step of tightly sealing the sensor elements severally with lid members, and a step of cutting the semiconductor wafer to separate the tightly sealed sensor elements asunder.

The objects described above are also accomplished by a method for the production of an infrared sensor which comprises a step of forming a first insulating film intended to form a bridging part on one of the main surfaces of a sensor substrate made of a semiconducting material and a second insulating film containing an opening for etching on the other main surface of the sensor substrate, a step of forming an infrared temperature-sensitive film on the first insulating film, a step of forming on the first insulating film an electrode pad provided in the uppermost layer thereof with an etchant-resistant electrically conductive film in such a manner as to be electrically connected to the infrared temperature-sensitive film, a step of forming a third insulating film on the sensor substrate including the electrode pad and selectively forming in the third insulating film a contact hole deep enough to reach the electrode pad, and a step of anisotropically etching the sensor substrate through the opening mentioned above after the formation of the contact hole thereby forming a bridging part.

The objects described above are further accomplished by a method for the production of an infrared sensor which comprises a step of forming a first insulating film on the obverse surface of a sensor substrate and then forming an infrared temperature-sensitive film on the insulating film, a step of forming a second insulating layer in such a manner as to cover the infrared temperature-sensitive film, a step of forming a first etchant-resistant film containing a prescribed contact hole pattern on the second insulating film and etching the second insulating film while using the first etchant-resistant film as a mask thereby forming in the second insulating film a contact hole deep enough to reach the infrared temperature-sensitive film, a step of superposing an electrically conducting layer on the second insulating film having the contact hole formed therein, and a step of forming on the electrically conductive layer a second etchant-resistant film containing an electrode pattern having a greater width than the contact hole pattern of the first etchant-resistant film and etching the electrically conductive layer with the second etchant-resistant film as a mask thereby forming an electrode.

The objects described above are further accomplished by an infrared sensor which comprises a sensor substrate containing a cavity and having an infrared temperature-sensitive film disposed in the cavity and vacuum sealing means covering the cavity in the sensor substrate and sealing the infrared temperature-sensitive film so as to keep the periphery thereof in a vacuum state.

In the infrared sensor of this invention, since the sensing part is constructed by forming the infrared temperature-sensitive film on the bridging part and, at the same time, tightly sealing the sensing part, the bridging part and the infrared temperature-sensitive film inside the sensor proper can be protected infallibly and a small infrared sensor can be produced inexpensively.

Further since the infrared sensor of this invention is provided with a sensor substrate made of a semiconducting material and furnished with a bridging part, an infrared temperature-sensitive film formed on the bridging part of the sensor substrate, and an electrode pad electrically connected to the infrared temperature-sensitive film and formed of a laminate film including an etchant-resistant electrically conductive film, the electrode pad can be anisotropically etched with a strong alkali liquid after the formation of a contact hole therein and, as a result, the bridging part can be stably obtained.

In the infrared sensor of this invention, since the part of the electrode on the infrared temperature-sensitive film which rises above the second insulating film is given a width larger than the width of the part of the electrode which lies within the contact hold, no gap is formed between the electrode and the second insulating film and no dispersion in the magnitude of electrical resistance of the infrared temperature-sensitive film is allowed.

In the method of this invention for the production of the infrared sensor, since the lid members are disposed so as to seal tightly the bridging parts and the infrared temperature-sensitive film in the sensor elements before the sensor elements are separated asunder, possible leakage of cooling water into the sensor elements during the process of separation can be avoided. This method, therefore, is effective in preventing the bridging parts in the sensor elements from breakage, notably improving the yield of production, and enhancing the ease of handling of the produced sensor elements.

By the method of this invention for the production of an infrared sensor, an electrode pad provided in the uppermost layer thereof with an etchant-resistant electrically conductive film is formed and a contact hole is bored therein before the anisotropic etching with a strong alkali liquid is carried out. Since the etchant-resistant electrically conductive film is already formed in the uppermost layer of the electrode pad when the anisotropic etching commences, this method is effective in precluding the possibility of the electrode pad being dissolved with the etchant and the bridging part being broken consequently and improving the yield of production.

The method of this invention for the production of an infrared sensor comprises a step of forming a first insulating film on the obverse surface of a sensor substrate and then forming an infrared temperature-sensitive film on the insulating film, a step of forming a second insulating film in such a manner as to cover the infrared temperature-sensitive film, a step of forming on the second insulating film a first etchant-resistant film containing a prescribed contact hole pattern and etching the second insulating film while using the first etchant-resistant film as a mask thereby boring a contact hole in the second insulating film to a depth sufficient to reach the infrared temperature-sensitive film, a step of superposing an electrically conductive layer on the second insulating film having the contact hole bored therein, and a step of forming on the electrically conductive layer a second etchant-resistant film containing an electrode pattern having a larger width than that of the contact hole pattern of the first etchant-resistant film and etching the electrically conductive layer with the second etchant-resistant film as a mask thereby forming an electrode. Even when the phenomenon of side etching is allowed to occur in the electrically conductive layer during the process of etching the electrically conductive layer with the second etchant-resistant film as a mask, it is prevented from producing a gap between the electrode and the second insulating layer, and thereby damaging the infrared temperature-sensitive film, or causing dispersion in the magnitude of electrical resistance.

Since the infrared sensor of this invention seals the infrared temperature-sensitive film so tightly as to keep the periphery thereof in a vacuum state as described above, it is capable of minimizing the amount of infrared radiation energy lost through the infrared temperature-resistant film and is effective in notably enhancing the sensitivity of the sensor.

BRIEF DESCRIPTION OF THE DRAWINGS

FIGS. 3A–3J are longitudinal cross sections representing a series of steps followed in the production of the infrared sensor shown in FIG. 1.

FIG. 4 is a longitudinal cross section illustrating an infrared sensor as another embodiment of this invention.

FIGS. 5A to 5I are longitudinal cross sections representing a series of steps followed in the production of the infrared sensor shown in FIG. 4.

FIGS. 9A to 9E are cross sections representing a series of steps followed in the production of the infrared sensor shown in FIG. 7.

DESCRIPTION OF THE PREFERRED EMBODIMENT

Figure 1:
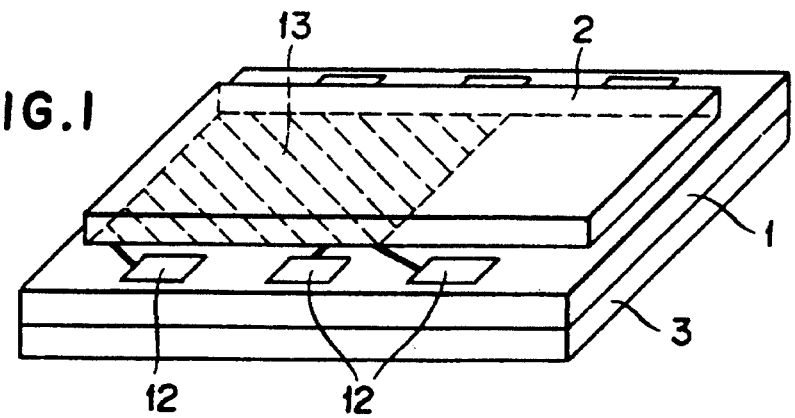
FIG. 1 is a perspective view of an infrared sensor as one embodiment of this invention.

As the supporting substrate for the sensor proper, substrates of such semiconductors as silicon and germanium are used. Preferably, silicon substrates which can be obtained easily and inexpensively are used. The infrared temperature-sensitive film is formed of a film of amorphous germanium (a-Ge), polycrystalline geranium, amorphous silicon (a-Si), or polycrystalline silicon, for example. For the formation of this infrared temperature-sensitive film, such techniques as spattering, ion beam sputtering, and CVD (chemical vapor deposition) are available.

The bridging part can be formed of silicon oxide film ($SiO_x$), silicon nitride film ($SiN_y$), or silicon oxynitride film ($SiO_xN_y$), for example. Preferably, it is formed of silicon oxynitride film. The silicon oxynitride film combines the properties of both silicon oxide film and silicon nitride film and, therefore, enjoys ideal stress balance and allows formation of a stable bridging structure. For the formation of the bridging part, a method which comprises forming an excavated part in the supporting substrate, temporarily refilling the excavated part thereby forming a sacrificial layer, forming a pattern of the bridging part on the sacrificial layer and, at the same time, forming an infrared temperature-sensitive film on the bridging part pattern, and then removing the sacrificial layer and giving rise to the bridging part is available. Another method which comprises forming a pattern for the bridging part and an infrared temperature-sensitive film on one of the surfaces of the supporting substrate, etching the other surface of the supporting substrate thereby forming a cavity under the bridging part pattern thereby giving rise to the bridging part, and further forming a lid member on the other surface in such a manner as to cover the cavity is also available. The latter method is easier to carry out from the procedural point of view than the former method.

As the material for the lid member, various semiconductor substances such as silicon and various metallic substances are usable. A silicon substrate is preferably used because of its low price and stable quality. When the lid member is made of the silicon substrate and it is used in a thermometer for the measurement of a body temperature, the transmittance of this lid member to infrared radiation of a wavelength of about 10 μm emanating from the human body is about 50%. When the infrared sensor is constructed by installing two identical infrared temperature-sensitive films in the sensor proper, exposing one of the infrared temperature-sensitive films to infrared radiation, and shielding the other infrared temperature-sensitive film from the infrared radiation, the side of the sensor proper which is covered with the lid member must be furnished with an infrared-intercepting film which is formed of aluminum (Al), for example.

The method of this invention for the production of an infrared sensor comprises a step of forming on a semiconductor wafer a plurality of sensor elements provided on a bridging part thereof with an infrared temperature-sensitive film, a step of tightly sealing the sensor elements individually with lid members, and a step of separating the tightly sealed sensor elements asunder.

By this method of production, since the sensor elements are tightly sealed individually with the lid members prior to the step of separating them as under (dicing step) and in the subsequently assumed state of being cut off by dicing, invasion by cooling water can be prevented and the bridging parts thereof are protected against breakage. When the produced infrared sensor is exposed to the impact of handling or it is incorporated into the probe, the possibility of the bridging part being broken by the shock is avoided because it is protected with the lid member.

Though adhesive agent or solder is usable for the union of the lid member with the sensor proper, this union may be obtained by the method of anode bonding. This method allows elimination of the effects of air convection and improves the sensor properties because it is capable of tightly sealing the sensor proper so as to keep the interior thereof in a vacuum state.

Further, in the infrared sensor according to this invention, the contact hole is formed on the electrode pad and the electrode pad is exposed because the electrode pad is formed so as to include therein an etchant-resistant electrically conductive film.

By the method of this invention, the possibility of the electrode pad being dissolved with the etching liquid is nil because the etchant-resistant electrically conductive film has been already formed in the uppermost layer of the electrode pad when the anisotropic etching is carried out with such a strong alkali liquid as hydrazine after the formation of the contact hole in the third insulating film on the electrode pad. Since the formation of the contact hole is not required to follow the formation of the bridging part, the bridging part is not broken and the yield of production is improved.

The electrode pad is generally formed of an aluminum (Al) film. For the etchant-resistant film of the uppermost layer, a copper (Cu) film or a gold (Au) film is used. When the etchant-resistant film is formed of a copper film, it is preferably overlaid with a nickel (Ni) film for prevention from oxidation.

In the infrared sensor produced in accordance with this invention, the upper peripheral part of the contact hole formed on the second insulating film is so shaped as to be covered with the part of the electrode which is given an increased width. In the structure of this kind, even when the phenomenon of side etching is allowed to occur during the fabrication of the electrode by etching, it only narrows the part of increased width and avoids inserting a gap between the electrode and the second insulating film, corroding the infrared temperature-sensitive film, or causing dispersion in the magnitude of electrical resistance.

The method of this invention for the production of an infrared sensor comprises a step of forming a first insulating film on the surface of a sensor substrate and then superposing an infrared temperature-sensitive film on the insulating film, a step of forming a second insulating film in such a manner as to cover the infrared temperature-sensitive film, a step of forming a first etchant-resistant film containing a prescribed contact hole pattern on the second insulating film and etching the second insulating film whale using the first etchant-resistant film as a mask thereby producing in the second insulating film a contact hole deep enough to reach the infrared temperature-sensitive film, a step of superposing an electrically conductive layer on the second insulating film having the contact hole formed therein, and a step of forming on the electrically conductive layer a second etchant-resistant film containing an electrode pattern having a greater width than the contact hold pattern of the first etchant-resistant film and etching the electrically conductive layer with the second etchant-resistant film as a mask thereby forming an electrode.

By this methods the electrode pattern of the second etchant-resistant film has a greater width than the contact hole pattern of the first etchant-resistant film when the electrically conductive layer is etched with the second etchant-resistant film as a mask. Even when the phenomenon of side etching is allowed to occur in the electrically conductive layer, the method prevents the insertion of a gap between the electrode and the second insulating film, corroding of the infrared temperature-sensitive film, or causing dispersion in the magnitude of electrical resistance.

Now, the present invention will be described specifically below with reference to embodiments illustrated in the annexed drawings.

Figure 2:
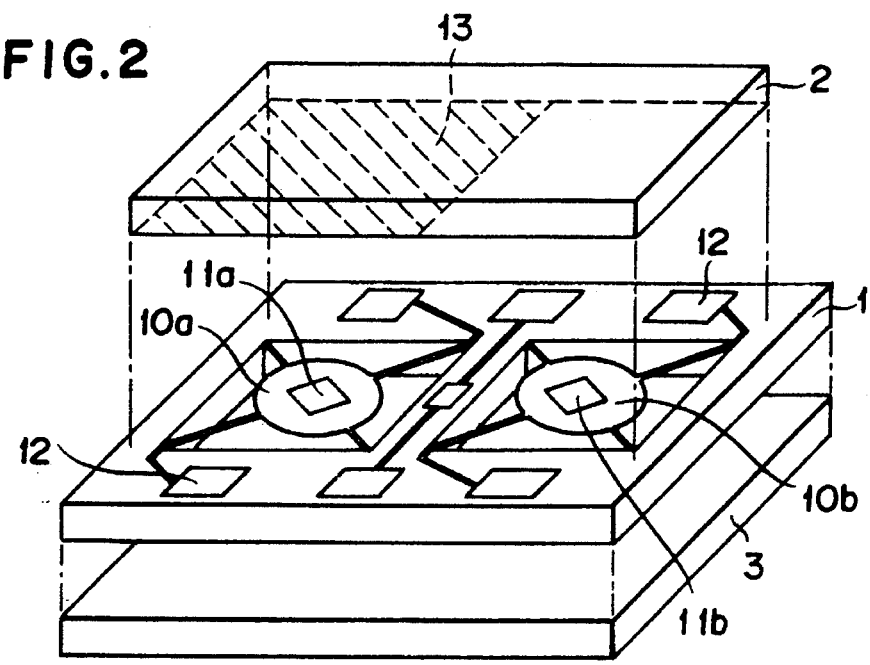
FIG. 2 is a perspective view illustrating the infrared sensor of FIG. 1 in a disassembled state.

FIG. 2 is a perspective view illustrating an infrared sensor as one embodiment of this invention, in a state ready for assembly. FIG. 1 illustrates this infrared sensor in an assembled state.

The infrared sensor of this embodiment is constructed by joining a front lid 2 to the obverse surface of a sensor proper 1 and a rear lid 3 to the reverse surface thereof. The sensor proper 1 is provided with a pair of bridging parts 10a, 10b perfectly identical in construction. On the central parts of these bridging parts 10a, 10b, infrared temperature-sensitive films 11a, 11b are respectively formed. A plurality of electrode pads 12 are disposed around the bridging parts 10a, 10b and these electrode pards 12 are electrically connected to the infrared temperature-sensitive films 11. The front lid 2 is formed of a silicon substrate of a size slightly smaller than the sensor proper 1. On the reverse surface of the front lid 2 in one half of the lid opposite to the infrared temperature-sensitive film 11a on the lefthand side in the bearings of the diagram, an infrared-intercepting film 13 made of an aluminum film is formed. The rear lid 3 is likewise formed of a silicon substrate in a size equal to the size of the sensor proper 1.

In this infrared sensor, the infrared radiation impinging on the obverse surface of the infrared sensor penetrates the front lid 2 and selectively reaches the infrared temperature-sensitive film 11b. The infrared sensor can detect the true amount of infrared radiation by measuring through the medium of the electrode pads 12 the differential output of the infrared temperature-sensitive film 11b exposed to the infrared radiation and the infrared temperature-sensitive film 11a shielded from the infrared radiation. The infrared radiation tending to enter the infrared sensor from the reverse surface side thereof is intercepted by the rear lid 3.

In the infrared sensor of the present embodiment, the front lid 2 and the rear lid 3 both made of silicon are respectively joined to the obverse and reverse surfaces of the sensor proper 1 so as to protect the bridging parts 10a, 10b and the infrared temperature-sensitive films 11a, 10b disposed inside the sensor proper 1. This infrared sensor, therefore, is allowed a notable decrease in size and consequently a reduction in the cost of production as compared with the conventional infrared sensor enclosed with a container such as a can.

FIGS. 3A to 3J illustrate a series of steps followed in the production of the infrared sensor described above.

Figure 3A:
Figure 3B:
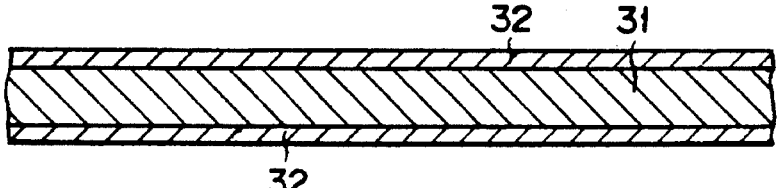
Figure 3C:
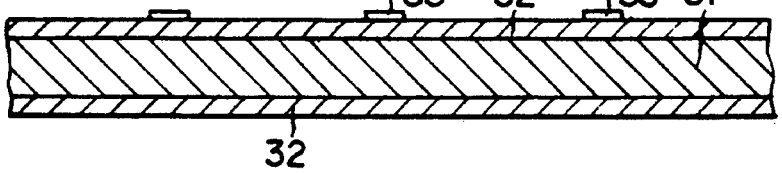

First, a silicon substrate (silicon wafer) 31 having a crystal face orientation (100) as shown in FIG. 3A was prepared. Then, on the obverse surface of this silicon substrate 31, a silicon oxynitride film 32 of a thickness of 1 μm was formed as shown in FIG. 3B by the plasma CVD (chemical vapor deposition) method. Subsequently, on the silicon oxynitride film 32, a multiplicity of infrared temperature-sensitive films 33 were formed as spaced at a fixed interval as shown in FIG. 3C. To be specific, by means of sputtering with germanium (Ge) as a target, an germanium (a-Ge) film was formed on the silicon oxynitride film 32. By a subsequent annealing treatment at 500° C., impartation of an increasingly polycrystalline structure to this amorphous germanium was promoted. Then, the germanium film which had acquired the polycrystalline structure was patterned by reactive ion etching.

The silicon substrate 31 was heated to 150° C. Then, by the technique of vacuum deposition, a chromium (Cr) film 34a of a thickness of 0.05 μm, a copper (Cu) film 34b of a thickness of 1.0 μm, and a nickel (Ni) film 34c of a thickness of 1 μm were sequentially superposed to form a laminate composite film 34 on the obverse surface and reverse surface of the hot silicon substrate 31 as shown in FIG. 3D. In the laminate film, the chromium layer 34a was intended as an adhesive layer with the foundation, the copper layer 34b as an electrically conductive layer, and the nickel layer 34c as an antioxidant film for the copper layer 34b. Then, the laminate composite film 34 on the obverse surface alone was patterned to obtain selective survival of the laminate composite film 34 around each of the infrared temperature-sensitive films 33.

Then on the obverse surface of the silicon substrate 31, an electrode wiring layer and electrode pads were formed, though not illustrated in the diagram, and the silicon oxynitride film 32 was patterned after the fashion of bridges. Subsequently, with the aid of the openings which are consequently formed in the silicon oxynitride film 32, the silicon substrate 31 was etched selectively to give rise to cavities 35 and bridging parts 33a as shown in FIG. 3E. This etching was carried out anisotropically by the use of an aqueous hydrazine solution. Optionally, this anisotropic etching may be performed by the use of an aqueous potassium hydroxide solution.

A rear lid 36 was joined by the technique of soldering to the reverse surface of the silicon substrate 31 as shown in FIGS. 3F and 3G. This rear lid 36 was formed in the same size as the silicon substrate 31. Similarly to the silicon substrate 31, the rear lid 36 was provided in advance with a laminate composite film 37 composed of a chromium film 37a, a copper film 37b, and a nickel film 37c and obtained by the technique of vacuum deposition.

After the rear lid 36 had been joined as described above, the plurality of sensor elements were individually tested with a probe to select conforming articles. To the surfaces of the sensor elements selected as conforming articles, such front lids 38 as shown in FIG. 3H were joined with flip chip bonder so as to cover the bridging parts 33a and the infrared temperature-sensitive films 33. The front lids 38, similarly to the rear lid 36, were each provided in advance with a laminate composite film 38 composed of a chromium film 38a, a copper film 38b, and a nickel film 38e and obtained by the technique of vacuum deposition. After the front lids 38 had been joined to all the sensor elements, the sensor elements were separated asunder by cutting with a dicing saw as shown in FIG. 3I, to obtain sensor elements having the opposite surfaces thereof protected with front lids 38 and rear lids 36 as shown in FIG. 3J.

In the present embodiment, since the front lids 38 and the rear lids 36 were made to cover the obverse and reverse surfaces of the sensor proper by the method described above, the bridging parts 32a formed in the sensor proper sustained virtually no injury from the impact of the cooling water to be used for the purpose of preventing evolution of heat during the process of dicing. Thus, the yield of the production in this case was 98%, a notably high level as compared with the level of 50% obtained in the production in which chips were separated asunder and then lids were joined to the separate chips. The separate chips produced in the present embodiment allowed decisively improved convenience of handling.

In the present embodiment, the bridging parts 32a and the infrared temperature-sensitive films 33 formed internally were protected by joining the front lids 38 and the rear lid 36 to the opposite surfaces of the silicon substrate 31. In the case of the method which relies on a sacrificial layer for the formation of bridging parts, it is sufficient to use only front lids 38 because the reverse surface side of the silicon substrate 31 is closed. The embodiment described above represents a case of preparatorily dividing the front lids 38 from one another, covering the sensor elements individually with the separate front lids 38, and thereafter separating the sensor elements asunder by cutting with a dicing saw. Optionally, the production of these separate sensor elements may be accomplished by joining the silicon substrate 31 with one rear lid 96 and one front lid 38 each in the form of a wafer and subsequently separating the individual sensor elements by cutting the silicon substrate 31 in conjunction with the corresponding portions of the rear lid 36 and front lid 38. The embodiment cited above has been described as using an infrared sensor of the type admitting the incident infrared radiation from the obverse surface side of the sensor proper 1. It is naturally permissible to use an infrared sensor of the type admitting the incident infrared radiation from the reverse surface side of the sensor proper 1.

In an infrared sensor 110 which is obtained in the present embodiment, a cavity 121 is formed in a silicon substrate 111 as a sensor substrate. On the upper side of this cavity 121, a silicon oxynitride ($SiO_xN_y$) film 112 provided with a bridging part 112a measuring 20 µm in width, 2 mm in length, and 3 µm in thickness is formed. An infrared temperature-sensitive film 114 is disposed on the upper surface in the central part of the bridging part 112a. This infrared temperature-sensitive film 114 is formed of amorphous germanium (a-Ge), for example. To the infrared temperature-sensitive film 114, one terminal part of an electrode wiring layer 115 formed of an aluminum (Al) film, for example, is electrically connected. In the peripheral part on the silicon substrate 111, electrode pads 130a, 130b are superposed on the electrode wiring layer 115.

The electrode pads 130a, 130b are each formed of a laminate film composed of a chromium (Cr) film 116 and a copper (Cu) film 117. The obverse surface of the silicon substrate 111 is covered with a silicon oxynitride film 118 as a protective film. In this silicon oxynitride film 118, contact holes are bored as opposed respectively to the electrode pads 130a, 130b. Inside these contact holes 119, a nickel (Ni) film 122 is superposed on the copper film 117 for the purpose of preventing the copper film 117 from oxidation. To the nickel film 122, a flexible printed substrate (not shown) is electrically connected as by soldering. On the lower surface of the silicon substrate 111, a silicon oxynitride film 113 intended for the formation of bridging parts is formed.

In this infrared sensor 110, the incident infrared radiation is injected into the infrared temperature-sensitive film 114. The magnitude of electricalal resistance of the infrared temperature-sensitive film 114 is varied in accordance with the amount of the infrared radiation (temperature). Since the magnitude of the electric current flowing to the electrode wiring layer 115 is varied and the magnitude of the voltage between the electrode pads 130a, 130b is consequently varied in accordance with the variation in the magnitude of this electrical resistance, the temperature of the object under test can be determined by detecting the variation in the magnitude of electric current or that of voltage in a signal processing circuit through the medium of a flexible printed substrate (not shown).

FIGS. 5A to 5F illustrate a series of steps to be followed in the production of the infrared sensor 110 mentioned above.

First, a silicon substrate 111 having a crystal face orientation (100) as shown in FIG. 5A was prepared. On the opposite surfaces of this silicon substrate 111, silicon oxynitride films 112, 113 having a thickness of 1 µm as shown in FIG. 5B were formed as first and second insulating films by the technique of plasma CVD. To be specific, the silicon substrate 111 was heated to 450° C. and the hot silicon substrate was swept with reactant gases, i.e. monosilane ($SiH_4$) fed at a flow rate of 15 SCCM, nitrogen ($N_2$) 203 SCCM, and nitrous oxide ($N_2O$) 32 SCCM, under the film-forming conditions of 0.45 Torr of pressure and 400 W of high frequency output to effect vapor-phase deposition of silicon oxynitride on the opposite surfaces of the silicon substrate 111 for 20 minutes.

Then, the silicon oxynitride film 112 superposed on the surface of the silicon substrate 111 was patterned to give shape to the bridging part 112a. This patterning was effected by reactive ion etching (RIE) and continued until the underlying silicon substrate 111 was exposed. For this etching, methane trifluoride ($CHF_3$) and oxygen ($O_2$) were used as etching gases and they were fed at respective flow volumes of 47.5 SCCM and 2.5 SCCM. The etching conditions employed herein were 0.075 Torr of pressure, 150 W of high frequency output, and 3 hours of time.

Subsequently, on the upper surface in the central part of the silicon oxynitride film 112, an infrared temperature-sensitive film 114 as shown in FIG. 5C was formed. To be more specific, by means of sputtering with germanium (Ge) as a target, an amorphous germanium (a-Ge) film was superposed on the silicon oxynitride film 112. This sputtering was carried out under continued flow of argon (Ar) gas at a flow volume of 4 SCCM under the conditions of $3 \times 10^{-3}$ Torr of film-forming pressure, 160 W of high frequency output, and 10 minutes of time. Then, by means of an annealing treatment at 400° C. impartation of an increasingly polycrystalline structure to the amorphous germanium was promoted. The amorphous germanium film which had undergone the impartation of a polycrystalline structure was patterned by reactive ion etching. The silicon substrate 111 was then heated to 150° C. On the obverse surface of the hot silicon substrate, an aluminum film of a thickness of 0.5 µm was superposed as by the technique vacuum deposition. This aluminum film was patterned to give rise to an electrode wiring layer 115 as shown in FIG. 5D.

Then, electrode pads 130a, 130b were formed in the edge parts of the silicon substrate 111 as shown in FIG. 5E. To be more specific, on the electrode wiring layer 115, a chromium (Cr) film 116 of a thickness of 0.05 µm and a copper (Cu) film 117 of a thickness of 1.5 µm as an etchant-resistant film were formed sequentially by the technique of vacuum deposition. On the surface of the silicon substrate 111, a silicon oxynitride film 118 of a thickness of 1 µm was formed as a third insulating film as shown in FIG. 5F.

Then, in the silicon oxynitride film 118, the contact holes 119 were formed so as to correspond to the electrode pads 130a, 130b as shown in FIG. 5G. Subsequently, an opening part 120 was formed in the silicon oxynitride film 113 on the reverse surface by selectively etching this film 113.

Then, via this opening part 120, the silicon substrate 111 was selectively etched from the reverse surface side to form the cavity 121 as shown in FIG. 5H. This etching was carried out anisotropically by the use of an aqueous hydrazine solution as an etching liquid at a temperature of 110° C. for one and a half hours to a depth reaching the silicon oxynitride film 112 on the obverse surface of the silicon substrate 111. Optionally, this etching may, instead, be performed by the use of an aqueous potassium hydroxide solution.

Figure 5I:
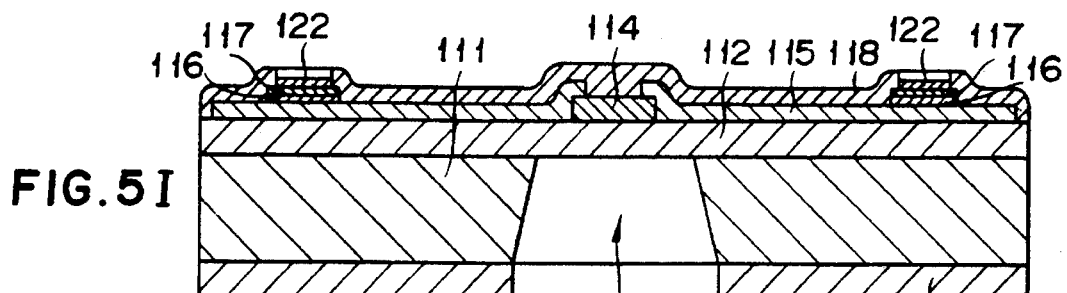
Figure 6:
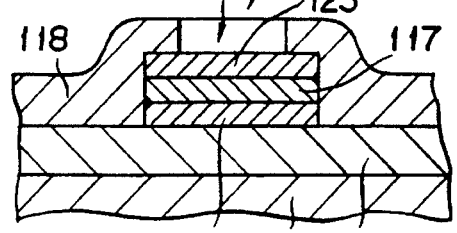
FIG. 6 is a longitudinal cross section illustrating an infrared sensor as yet another embodiment of this invention.

Then, in the contact holes 119 of the electrode pads 130a, 130b, the nickel films 122 for preventing the copper films 117 from oxidation were formed by the technique of electroless plating as shown in FIG. 5I. This plating was effected by immersion in a plating liquid (product of Okuno Seiyaku Kogyo K. K. and marketed under trademark designation of "Top Chemicalloy B-1") at 65° C. for five minutes until the nickel films 122 grew to a thickness of 1 μm.

By the method of the present embodiment, since the copper films 117 possessing an etchant-resistant property have been already formed in the uppermost layers of the electrode pads 130a, 130b when the contact holes 119 are formed in the silicon oxynitride film 118 as the third insulating film and then the film 118 is subjected to anisotropic etching with a strong alkali liquid such as hydrazine, the possibility that the electrode pads 130a, 130b will be dissolved by the etching liquid is nil. Further, since the bridging parts 112a have not yet been formed when the contact holes 119 are formed on the upper surface of the silicon substrate 111, the bridging parts 112a are precluded from the otherwise inevitable breakage and the yield of production is notably improved.

The embodiment described thus far represents a case of forming the nickel films 122 for the prevention of the copper films 117 from oxidation subsequently to the step of anisotropic etching (FIG. 5I). Optionally, the formation of the nickel film 122 may be carried out before the step of anisotropic etching and after the formation of the contact holes 119.

Further, the embodiment cited above contemplates forming the electrode pads 130a, 130b each with a two-layer laminate film composed of a chromium film 116 and a copper film 117. This laminate film, when necessary, may be constructed in a three-layer structure having a gold (Au) film 123 additionally superposed on the copper film 117. This laminate has no use any longer for the nickel film 122 which is essentially used in the embodiment described above.

In the infrared sensor which is obtained as described above, the cavity 121 is tightly sealed as shown in FIG. 1 by joining thereto a front lid and a rear lid (neither shown herein).

Figure 7:
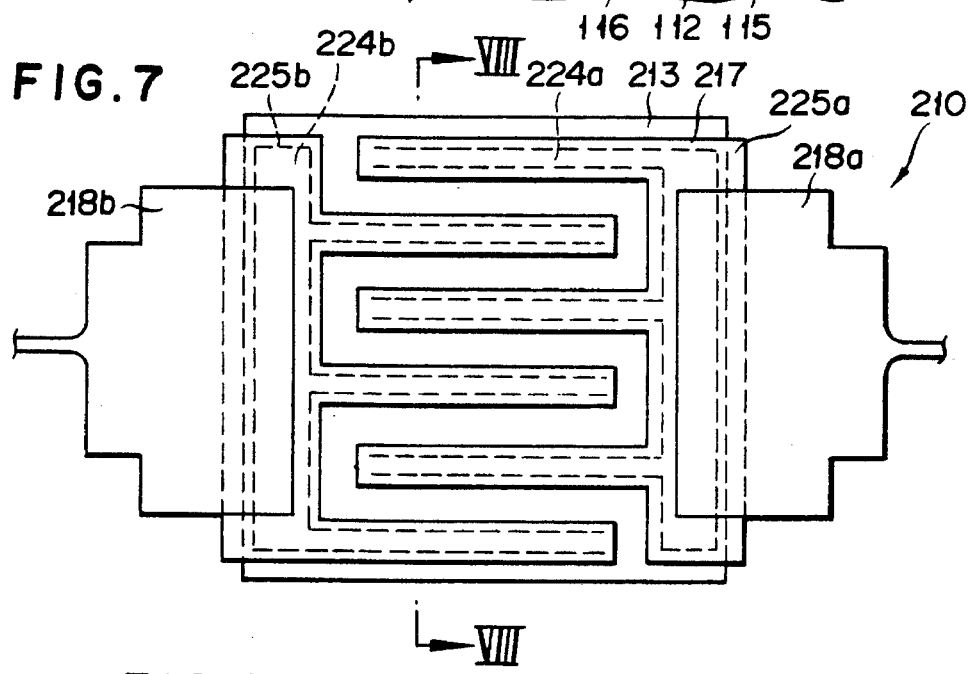
FIG. 7 is a plan view illustrating an infrared sensor as still another embodiment of this invention.
Figure 8:
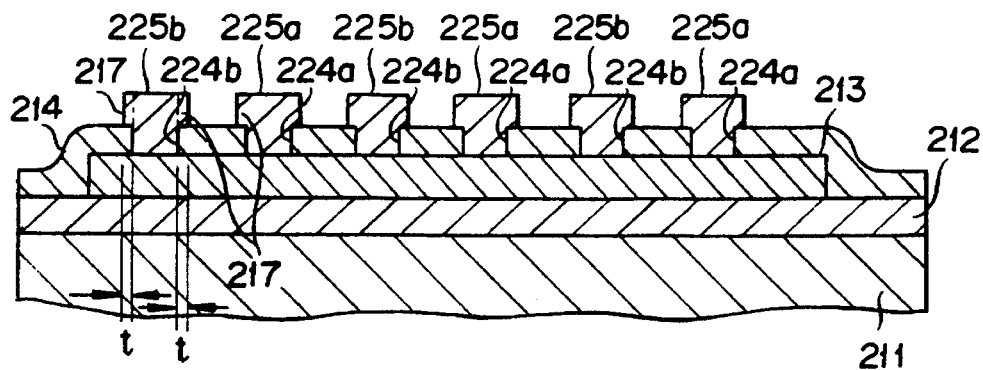
FIG. 8 is a cross section taken through FIG. 7 alone line VIII—VIII.

FIG. 7 is a plan view illustrating the construction of an infrared sensor 210 as yet another embodiment of this invention. FIG. 8 is a cross section taken through FIG. 7 along line VIII—VIII.

This infrared sensor 210 has a silicon oxynitride film 212 of a thickness of 1 μm formed as a first insulating film on the upper surface of a silicon substrate 211 as a sensor substrate. On this silicon oxynitride film 212, an infrared temperature-sensitive film 213 made of polycrystalline germanium is superposed. This infrared temperature-sensitive film 213 is covered with a silicon oxynitride film 214 as a second insulating film. In the silicon oxynitride film 214, contact holes 224a, 224b shaped like mutually opposed combs are formed.

On the silicon oxynitride film 214, electrodes 225a, 225b extending through the thickness of the contact holes 224a, 224b and reaching the infrared temperature-sensitive film 213 are formed. The electrodes 225a, 225b are made of an electrically conductive layer such as, for example, aluminum film. In a plan view, they are shaped like mutually opposed combs in conformity to the contact holes 224a, 224b. The electrodes 225a, 225b are connected to a wiring electrode (not shown) respectively through the medium of wiring layers 218a, 218b which are made of an aluminum film. The parts of the electrodes 225a, 225b rising above the silicon oxynitride film 214 have a width greater by a size, t, (5 μm, for example) than the width (10 μm, fop example) of the parts thereof extending through the concrete holes 224a, 224b. Thus, the electrodes 225a, 225b form parts of increased width 217 above the silicon oxynitride film 214 and, as a result, have a T-shaped cross section.

In this infrared sensor 211, the magnitude of electric resistance of the infrared temperature-sensitive film 213 is proportionately varied with the amount (heat quantity) of the incident infrared radiation. Thus, the amount of the radiation (temperature) can be detected by measuring with a signal processing circuit (not shown) the magnitude of electrical current flowing to the electrodes 225a, 225b and the wiring layers 218a, 218b or the magnitude of voltage generated between the wiring electrodes (not shown) in accordance with the variation in the magnitude of electric resistance.

In the infrared sensor 210 of the present embodiment, the parts (parts of increased width 217) of the electrodes 225a, 225b rising above the silicon oxynitride film 214 have a width greater than the width of the parts thereof extending inside the contact holes 224a, 224b and the edge parts of the upper surfaces of the contact holes 224a, 224b, therefore, are covered with the parts of increased width 217 of the electrodes 225a, 225b. In this infrared sensor 210, the parts of increased width 217 are etched and reduced in width even when the phenomenon of side etching is allowed to occur during the etching of the electrodes 225a, 225b. No dispersion occurs in the magnitude of electric resistance, therefore, because no gap is inserted between the electrodes 225a, 225b and the silicon oxynitride film 214 or no etching is callowed to occur on the infrared temperature-sensitive film 213.

FIGS. 9A to 9E illustrate a series of steps followed in the production of electrode parts in the infrared sensor 210.

First, the silicon oxynitride film 212 was formed by the technique of plasma CVD on the silicon substrate 211 as shown in FIG. 9A. Then, by means of sputtering, the infrared temperature-sensitive film 213 made of an amorphous germanium (a-Ge) film was formed in a thickness of 1 μm on the silicon oxynitride film 212. This sputtering was carried out by feeding argon (Ar) gas at a flow volume of 4 SCCM under the conditions of $3 \times 10^{-3}$ Torr of film-forming pressure, 160 W of high frequency output, and about 10 minutes of time. Then, by an annealing treatment performed at a temperature of 100° C. impartation of an increasing polycrystalline structure to the amorphous germanium was promoted. Subsequently, by reactive ion etching (RIE), the germanium film which had acquired a grown polycrystalline structure was patterned. This reactive ion etching was carried out by feeding Freon ($CF_4$) gas at a flow volume of 40 SCCM under the conditions of 0.2 Torr of pressure, 150 W of high frequency output, and about 10 minutes of time.

Then, by the technique of plasma CVD, the silicon oxynitride film 214 was-formed so as to cover the infrared temperature-sensitive film 213 on the silicon oxynitride film 212 as shown in FIG. 9B. Then, on this silicon oxynitride film 214, a photoresist film 226 containing a contact hole pattern (t1 in width) was formed. The silicon oxynitride film 214 was etched with the photoresist film 226 as a mask, to give rise to the contact holes 224a, 224b as shown in FIG. 9C.

Then, by performing vacuum deposition of aluminum at a temperature of 150° C. for about 8 minutes, an aluminum film 215 of a thickness of 1.5 μm was formed on the infrared temperature-sensitive film 213 as shown in FIG. 9D. Subsequently, on the aluminum film 215, a photoresist film 227 of a thickness of 1 μm containing an electrode pattern was superposed. Here, the width t2 of the electrode pattern in the photoresist 227 was greater by 2t than the width t1 of the contact holes 224a, 224b.

Thereafter, the aluminum film 215 was selectively etched wet with the photoresist film 227 as a mask to give rise to the electrodes 225a, 225b as shown in FIG. 9E. The wet etching was carried out at 40° C. for about 5 minutes by the use of an etching liquid composed of phosphoric acid ($H_3PO_4$), nitric acid ($HNO_3$), acetic acid ($CH_3COOH$), and water ($H_2O$) at a mixing ratio of 18:1:2:1. The infrared sensor 210 constructed as illustrated in FIG. 8 was obtained as a consequence of the process described above.

By this method, the electrode pattern in the photoresist film 227 has a greater width than the contact hole pattern of the photoresist 226 (FIG. 9B). Even when the phenomenon of side etching is allowed to occur in the aluminum film 215 during the etching of the aluminum film 215 at the step of FIG. 9E, only the parts of the electrodes 225a, 225b rising above the silicon oxynitride film 214 are etched and reduced in width. Thus, no gap occurs between the electrodes 225a, 225b and the silicon oxynitride film 214 or no etching is allowed to occur on the infrared temperature-sensitive film 213.

The infrared sensor of this invention is furnished with a cavity. In this cavity, it is provided with a sensor substrate having an infrared temperature-sensitive film superposed thereon and vacuum sealing means for covering the cavity and sealing the periphery of the infrared temperature-sensitive film in a vacuum state.

In this infrared sensor, since the infrared temperature-sensitive film is tightly sealed to keep the periphery thereof in a vacuum state, the amount infrared radiation energy lost through the infrared temperature-sensitive film is minimized and, as a result, the temperature rise of the infrared temperature-sensitive film is increased and the sensitivity of the sensor is remarkably enhanced.

The term "vacuum" as used in this specification shall be construed as designating a state in which the pressure is not higher than 1.0 Torr. Where the degree of vacuum is $10^{-3}$ Torr or less, the effect of this vacuum is substantially equal to that which is obtained when the pressure is $10^{-3}$ Torr.

More specifically, the infrared sensor of this invention is preferably so constructed as to have the sensor substrate thereof provided therein with a pair of cavities, the cavities provided individually with infrared temperature-sensitive films identical in structure, one of the infrared temperature-sensitive films adapted to admit infrared radiation selectively, and the other infrared temperature-sensitive film shielded from the infrared radiation. This infrared sensor, by detecting the difference between the output of the infrared temperature-sensitive film admitting the infrared radiation and that of the infrared temperature-sensitive film not admitting the infrared radiation, is able to determine the net amount of infrared radiation while precluding electrical noise and thermal disturbance. When the two cavities in this construction are made to communicate with each other, they can be maintained at one and the same degree of vacuum and the detection of infrared radiation can be attained with enhanced accuracy. The pair of cavities may be formed in one and the same sensor substrate. Otherwise, they may be formed separately in different sensor substrates on the condition that they are adapted to have sufficient thermal contact to maintain the same temperature.

For the sensor substrate, such semiconducting substrates of silicon, germanium, etc. are usable. Preferably, a silicon substrate is used because it can be obtained easily and less expensively.

Generally, the infrared temperature-sensitive films come in the bolemeter type, the thermopile type, the collector type, etc. The infrared temperature-sensitive film of the bolemeter type among other types proves to be particularly preferable in the sense that it allows minaturization of the sensor because the resistance of the sensor element varies with the variation in the temperature of the sensor caused by infrared radiation and, therefore, the amount of infrared radiation (temperature) can be directly detected from the magnitude of resistance. The infrared temperature-sensitive film in this case is formed of a film of amorphous germanium (a-Ge), amorphous silicon (a-Si), polycrystalline germanium, polycrystalline silicon, etc. For the formation of this infrared temperature-sensitive film, the techniques of sputtering, ion beam sputtering, CVD (chemical vapor deposition), etc. are available. For supporting the infrared temperature-sensitive film, such structures as a bridge of the type supported at the opposite ends thereof, a cantilever, and a diaphragm are usable. The structure of the bridge mentioned above among other structures proves to be particularly desirable for the purpose of decreasing the heat capacity and, at the same time, ensuring structural stability.

As the material for the bridging structure, a silicon oxide ($SiO_x$) film, a silicon nitride ($SiN_y$) film, a silicon oxynitride ($SiO_xN_y$) film, etc. are usable. The silicon oxynitride film among other materials cited above proves to be particularly preferable. The silicon oxynitride film combines the properties of both silicon oxide film and silicon nitride film and, therefore, enjoys an ideal stress balance and permits stable formation of the bridge structure. This bridging part can be produced by one superposing silicon oxynitride films on each of the opposite surfaces of a silicon substrate, with one of the surfaces patterned in advance after the fashion of a bridge and the other surface after the fashion of a window of desired size, and anisotropically etching the silicon oxynitride films with an aqueous hydrazine solution or potassium hydroxide (KOH), for example.

Specifically, the means fop vacuum sealing comprises lids (front lid and rear lid) which are joined to the opposite surfaces of the sensor substrate. The sealing of the sensor substrate sufficient to keep the interior thereof in a vacuum state is attained by joining one of the lids to one surface of the sensor substrate and then joining the other lid to the other surface of the sensor substrate held sa in an atmosphere of vacuum. For the lids, silicon substrates may be used. In this case, for the purpose of enabling one of the pair of infrared temperature-sensitive films to selectively admit infrared radiation, the silicon substrate which forms the lid for passing the infrared radiation is preferably provided on the opposite surfaces thereof with an infrared-reflecting film such as an aluminum film and to be provided partially in each of the infrared reflecting films with a window (opening part).

As means for joining the lids to the sensor substrate, the technique of solder welding and the technique of anode bonding are available. The anode bonding is a technique for joining glass (such as, for example, Pyrex glass) to silicon. It is said that the silicon substrate and glass are joined across their interface due to the covalent bond of silicon and oxygen atoms which exist at the interface. When this anode bonding technique is adopted, it is carried out under a vacuum to enable the periphery of the temperature-sensitive film of the infrared sensor to be kept in a vacuum state. To ensure this vacuum sealing, a glass layer must be interposed between the front lid of silicon and the sensor substrate of silicon and between the rear lid of silicon and the sensor substrate of silicon. For this purpose, it is necessary to have a thin glass film formed by the technique of sputtering, for example, on either of the front lid and the sensor substrate and either of the rear lid and the sensor substrate.

Now, the method for joining the lids to the sensor substrate by the anode bonding will be described more specifically below. First, a wafer cut in the shape of a rear lid (rear-lid wafer) is placed on a cathode and a wafer cut in the shape of a sensor proper (sensor-proper wafer) is placed on the rear-lid wafer. On the surface of the rear lid intended for contact, a low melting glass film is formed in advance by sputtering. On the sensor-proper wafer, a needle-shaped electrode is erected. A DC voltage in the range of 30 to 100 V is applied between this needle-shaped electrode and the cathode. The advance of the anode bonding is followed by monitoring the magnitude of the electrical current. Generally, the magnitude of electrical current decreases monotonously and ceases to decrease at the level of the leakage current (generally on the order of 1 mA, depending on the area of a sample). At the end of the anode bonding, the joined part is tested for leakage with a helium leak detector. Then, by following the same procedure, a wafer cut in the shape of a front lid (front-lid wafer) is joined to the first two wafers already joined. The work which follows the union of the lids to the sensor substrate is carried out inside a vacuum chamber for the purpose of sealing the sensor proper in a vacuum state. Since the opposition of the front lid to the joined wafers in an atmosphere of vacuum cannot be performed as effectively as in the open air, it must be carried out with the aid of an infrared scope as kept under constant observation through a vacuum quality inspection window (made of quartz). During the evacuation of the entrapped air for creation of a vacuum, they are separated with a sufficient space to provide ample conductance for the removal of the entrapped air from the tightly sealed space. They are not brought in a contact and joined until the fall in vacuum to a level below $10^5$ Torr has been confirmed. When the front lid and the rear lid are made of glass, they can be joined directly to the sensor substrate without requiring interposition of a thin glass film. When the silicon substrate and the lids of silicon are used as described above and they are both formed of single crystal, they serve ideally to maintain the cavity in a vacuum state because they have an extremely small gas content due to the quality of the single crystal and they are sparingly pervious to an external gas.

Now, this invention will be described more specifically below with reference to working examples.

Figure 10:
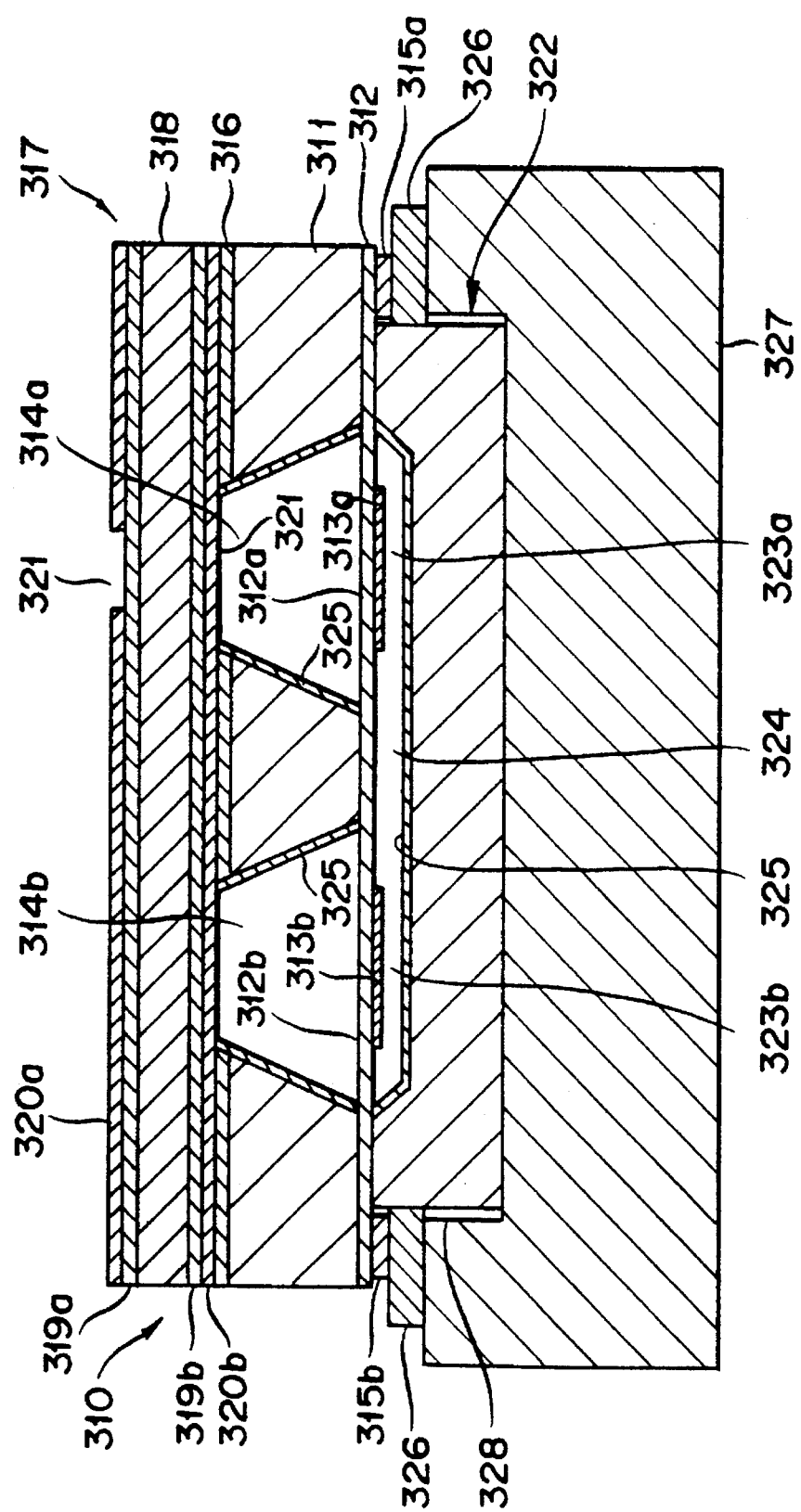
FIG. 10 is a longitudinal cross section illustrating an infrared sensor as a further embodiment of this invention.

FIG. 10 is a diagram illustrating the construction of an infrared sensor 310 as one embodiment of this invention. The infrared sensor 310 of this embodiment uses a silicon substrate (single crystal silicon) 311 as a sensor substrate. In the silicon substrate 311, two cavities 314a, 314b are formed. These cavities 314a, 314b each open in the upper and lower surfaces of the silicon substrate 311. On the lower surface of the silicon substrate 311, a silicon oxynitride (SiO$_x$N$_y$) film 312 containing two bridging parts 312a, 312b is formed. Infrared temperature-sensitive films 313a, 313b are formed on the lower surfaces in the central parts respectively of the bridging parts 312a, 312b. These infrared temperature-sensitive films 313a, 313b are formed of amorphous germanium (a-Ge), for example. To the infrared temperature-sensitive films 313a, 313b, single-terminal parts of electrode wiring layers formed of aluminum (Al) film are electrically connected though not shown in the diagram. The other terminal parts of the electrode wiring layers are connected to electrode pads 315a, 315b which are formed in the edge parts on the lower surface of the silicon substrate 311.

On the upper surface of the silicon substrate 311, a silicon oxynitride film 316 is formed. A front lid 317 is joined to the upper surface of this silicon oxynitride film 316. The front lid 317 is formed of a silicon substrate 318. On the obverse and reverse surfaces of this silicon substrate 318, infrared reflection preventing films 319a, 319b are respectively formed. On the obverse surfaces of these infrared reflection preventing films 319a, 319b, infrared-intercepting films 320a, 320b made of aluminum (Al) are formed. In these infrared-intercepting films 320a, 320b at the positions thereof opposed to the infrared temperature-sensitive film 313a falling on the right-hand side in the bearings, an opening part 321 for guiding the infrared radiation is formed. The front lid 317 is joined to the silicon oxynitride film 316 by the technique of high melting solder welding, for example.

To the lower surface of the silicon substrate 311, a rear lid 322 is joined. This rear lid 322 is formed of silicon like the front lid 317. In the upper surface of the rear lid 322, excavated parts 323a, 323b are formed as opposed to the cavities 314a, 314b of the silicon substrate 311. These excavated parts 323a, 323b are made to communicate with each other via a communicating part 324. The rear lid 322 is joined to the silicon oxynitride film 312 in a vacuum atmosphere by the technique of high melting solder welding or the technique of anode bonding. As a result, the infrared temperature-sensitive films 313a, 313b in the cavities 314a, 314b of the silicon substrate 311 and in the excavated parts 323a, 323b of the rear lid 322 are sealed under one and the same degree of vacuum.

On the wall surfaces of the cavities 314a, 314b and the excavated parts 323a, 323b, an infrared-reflecting film 325 made of nickel (Ni), for example, is formed so as to prevent the infrared radiation which has entered the infrared temperature-sensitive film 313a from further entering the other infrared temperature-sensitive film 313b. To the electrode pads 315a, 315b in the edge parts of the rear lid 222, FPC (flexible printed circuit) substrates are electrically connected. The infrared sensor 310 is wholly supported by a base 327 which is made of copper (Cu). A depression 328 is formed in the central part of the base 327. To this depression 328, the rear lid 322 is joined by the technique of low melting solder welding.

In this infrared sensor, the infrared radiation introduced from above in the bearings of the diagram is passed through the opening part 321 of the front lid 317 and the cavity 314a and then injected selectively into the infrared temperature-sensitive film 313a. The other infrared temperature-sensitive film 313b is shielded from the infrared radiation by the infrared-intercepting films 320a, 320b. The differential output between the infrared temperature-sensitive film 313a admitting the infrared radiation and the infrared temperature-sensitive film 313b expelling the infrared radiation is detected through the medium of the FPC substrate 326. Since the periphery of the infrared temperature-sensitive film 313a inside the cavity 314a and the excavated part 323a is maintained in a vacuum state, the energy of the incident infrared radiation is not lost through the air and the very small amount of infrared radiation emanating from a sample can be absorbed efficiently and the sensitivity of the sensor is enhanced. The infrared temperature-sensitive film 313b inside the other cavity 314b and the excavated part 323b is also maintained under the same degree of vacuum. Due to the differential output between the two infrared temperature-sensitive films 313a, 313b, the true amount of infrared radiation can be detected.

(First experimental example)

Figure 11:
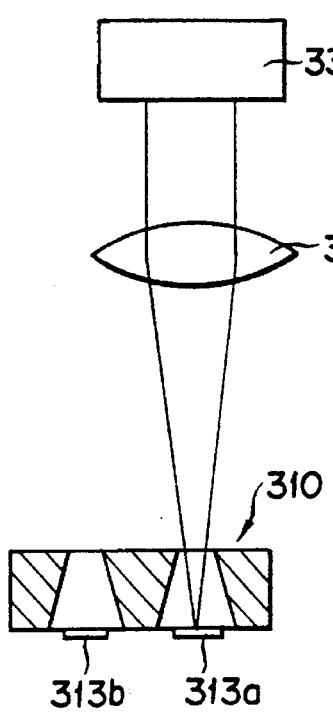
FIG. 11 is a diagram schematically illustrating the construction of a system used in the first example experiment conducted on this invention.

FIG. 11 schematically illustrates the construction of an experimental system used for confirming the effect of an infrared sensor embodying this invention. In this system, a semiconductor laser having an output wavelength of 673 nm was used as a light source 331. The light emanating from this semiconductor laser was condensed with a lens 332 on one infrared temperature-sensitive film 313a of the infrared sensor 310. Thus, the differential output which occurred between this infrared temperature-sensitive film 313a and the other infrared temperature-sensitive film 313b was obtained. The output from the semiconductor laser was made to occur in the form of a pulse so as to allow evaluation of the sensitivity of response of the infrared temperature-sensitive film 313a.

Figure 13:
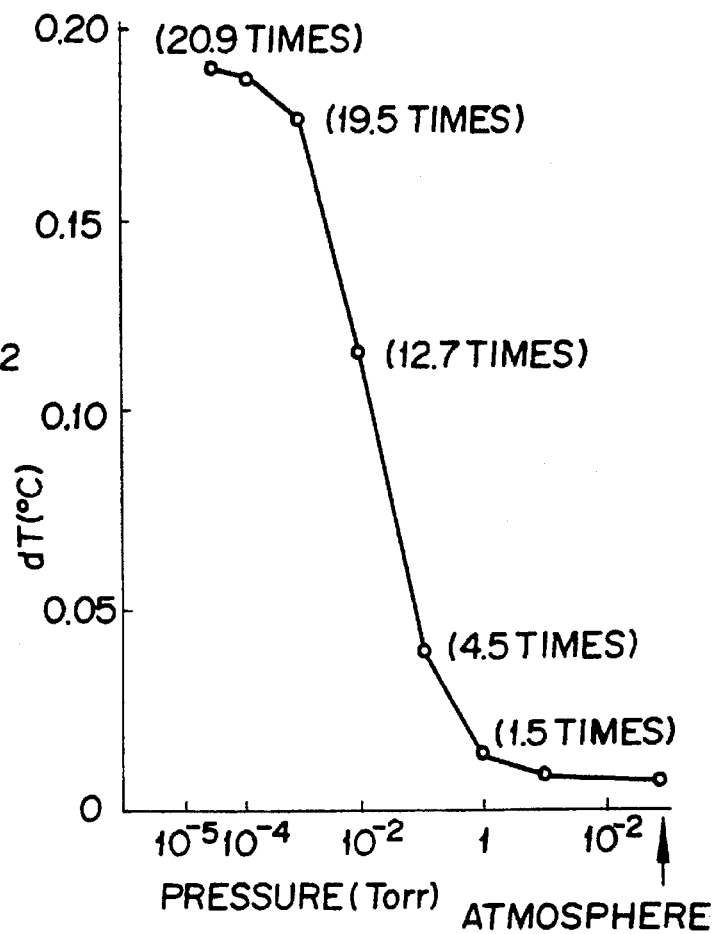
FIG. 13 is a graph showing the relationship between the degree of vacuum and the magnitude of temperature increase in comparison with the test results obtained in the open air.
Figure 12:
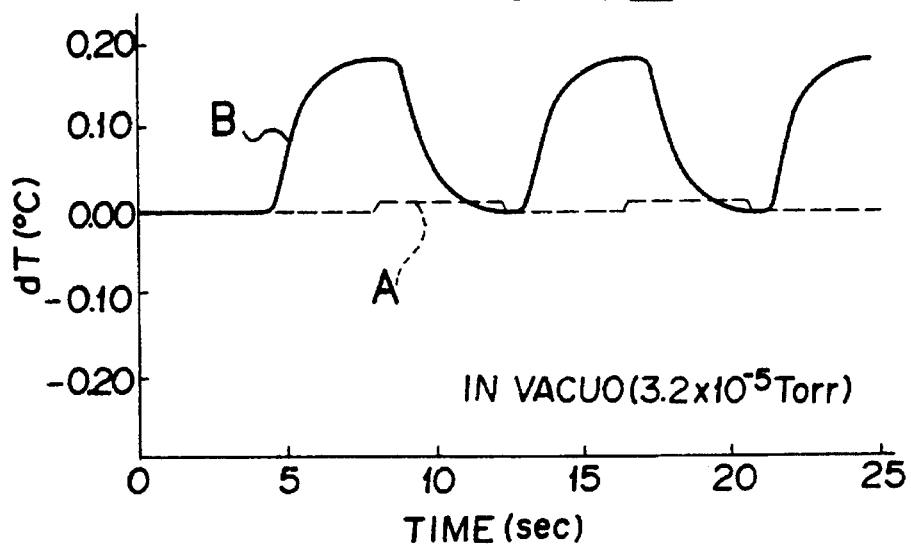
FIG. 12 is a graph showing the results of the test performed in the system of FIG. 11 and in vacuum.

Line A in FIG. 12 shows the results (relation between the time T and the value dT of rise of temperature) of a comparative experiment carried out on the infrared sensor 310 set in the open air. In this case, the differential output corresponding to the output of the semiconductor laser could not be clearly detected. Line B in FIG. 12 shows the results of an experiment carried out under the same conditions as described above, excepting the infrared sensor 310 was set under a vacuum (3.2×10$^{-3}$ Torr). The differential output could be clearly detected, indicating that the sensitivity of response was improved in this case. FIG. 13 shows the results of the same experiment carried out under the same conditions, except that the degree of vacuum P was varied to produce data usable for comparison with those obtained in the open air. In the data shown in the diagram, those enclosed with parentheses are the values given for the purpose of comparison with those obtained in the open air. The effect began to show clearly (1.5 times) when the degree of vacuum was 1.0 Torr and reached about 20 times when the degree of vacuum was about $10^{-3}$ Torr. When the degree of vacuum was lower than the level just mentioned, the sensitivity of response was substantially equal to that obtained at $10^{-3}$ Torr.

(Second experimental example)

Figure 14:
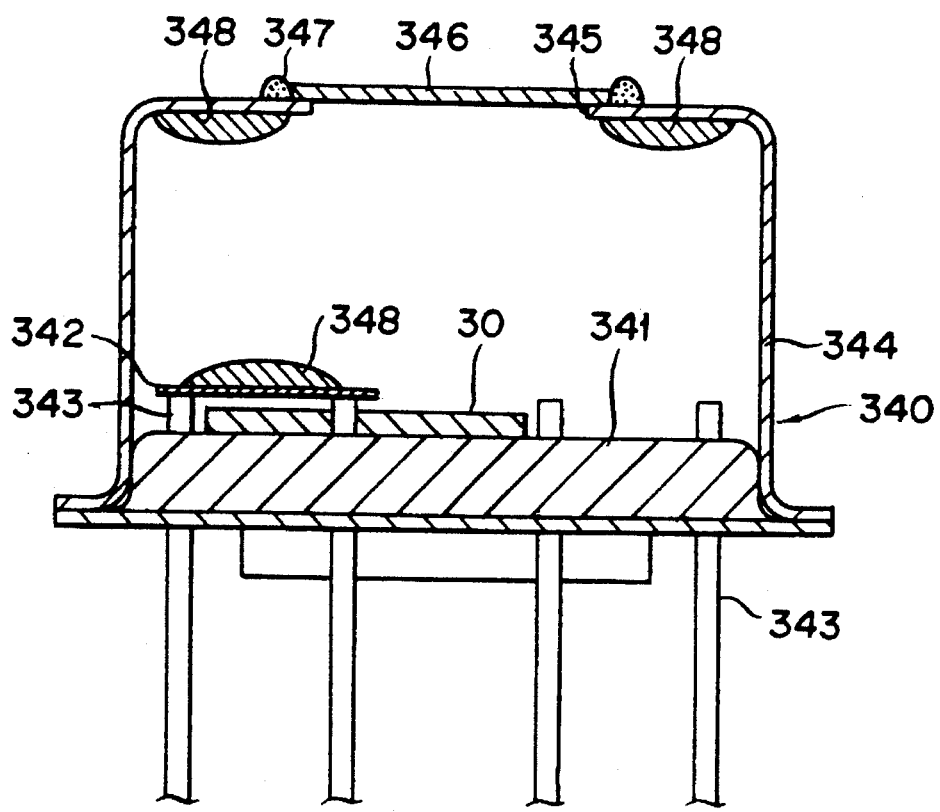
FIG. 14 is a cross section illustrating the construction of a package used for the second example experiment conducted on this invention.

FIG. 14 is a diagram illustrating an infrared sensor used in the second experimental example. An infrared sensor 310 of this experiment was sealed in a can package 340 and kept in a vacuum state. It was joined to the upper surface of a stem 341 by die bonding with a heat-resistant epoxy resin. An infrared-intercepting plate 342 was disposed on a lead terminal 343 of the can package 340. A cap 344 was joined by soldering to the upper surface of the stem 341. An upper opening part 345 of this cap 344 was covered with a reflection-proof film 346 made of silicon. The reflection-proof film 346 was fastened to the cap 344 with low melting glass 347. Getter members 348 for adsorbing the internal gas were attached fast to the inner ceiling surface of the cap 344 and to the infrared-intercepting plate 342. The getter members 348 were made of an aqueous solution of powder mixture of zirconium (Zr) and carbon (C) (a product of Giken Kagakusha K. K. having an activating temperature of 225° C.).

The vacuum sealing of the can package 340 was effected by placing the stem 341 and the cap 344 in a vacuum container, evacuating the entrapped air from the vacuum container to a vacuum (3×10$^{-6}$ Torr), heating the stem 341 and the cap 344 with their respective heaters to 230° C., continuing the removal of internal gas for three hours, and thereafter slowly joining the stem 341 and the cap 344. The solder used in this case was a product having a melting point of 221° C. and containing flux. The solder in a molten state was placed in advance on the stem 341 and the cap 344 in the open air. Afterwards, the flux floating on the solder surface was removed with trichloroethylene.

Figure 15:
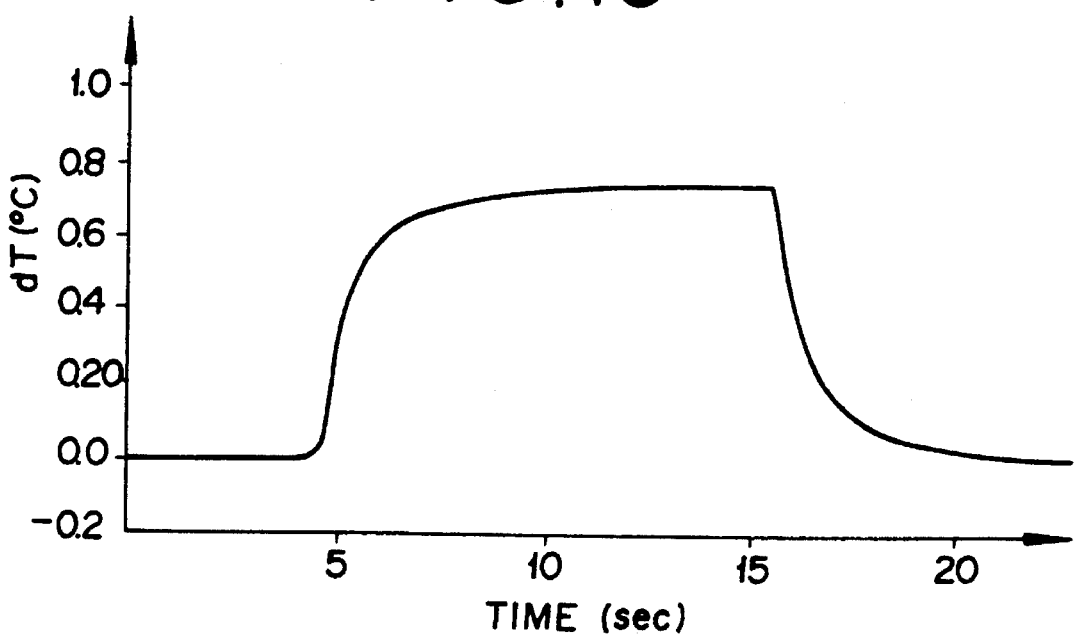
FIG. 15 is a graph showing the results of the second example or experiment.

FIG. 15 shows the results of the determination of infrared radiation with the infrared sensor using the can package 340 of FIG. 14. The data clearly indicate that the sensitivity of the present sensor was about 14 times as high as that obtained with the conventional sensor containing normal air.

What is claimed is:

1. A method for the production of an infrared sensor comprising forming a first insulating film on a first surface of a sensor substrate made of a semiconducting material; forming a second insulating film containing an opening for etching on a second surface of said sensor substrate; forming an infrared temperature-sensitive film on said first insulating film to produce a plurality of sensor elements; forming an electrode pad on said infrared temperature-sensitive film, said electrode pad being electrically connected to said infrared temperature-sensitive film and having an etchant-resistant electrically conductive film on its uppermost layer; forming a third insulating film on said electrode pad; forming a contact hole in said third insulating film, said contact hole having a depth reaching said electrode pad; anisotropically etching said sensor substrate through said contact hole to form a bridging part; vacuum sealing said sensor elements each with a lid member capable of tightly sealing said sensor elements; and separating the vacuum sealed sensor elements asunder by cutting.

2. A method according to claim 1, wherein said semiconductor wafer is a silicon wafer.

3. A method according to claim 1, which comprises forming a film of a bridge-forming material on one surface of a semiconductor wafer, forming an infrared temperature-sensitive film on the obverse surface of said film of bridge-forming material, forming a laminate composite film on one surface of said semiconductor wafer and a laminate composite film on the other surface of said semiconductor wafer around the periphery of said infrared temperature-sensitive film, partially etching said semiconductor wafer thereby forming a cavity therein, joining a second lid to the cavity side semiconductor wafer, joining a first lid to the upper surface of said laminate composite film on said infrared temperature-sensitive film, and separating the portions of said semiconductor wafer corresponding to said infrared temperature-sensitive films asunder by cutting.

4. A method according to claim 3, wherein said laminate composite film comprises a chromium layer, a copper layer, and a nickel layer.

5. A method for the production of an infrared sensor, comprising a step of forming a first insulating film intended for formation of a bridging part on one of the main surfaces of a sensor substrate made of a semiconducting material and forming a second insulating film containing an opening for etching on the other main surface of said sensor substrate, a step of forming an infrared temperature-sensitive film on said first insulating film, a step of forming on said first insulating film an electrode pad provided in the uppermost layer thereof with an etchant-resistant electrically conductive film in such a manner as to be connected electrically to said infrared temperature-sensitive film, a step of forming a third insulating film on said sensor substrate containing said electrode pad and selectively forming a contact hole in said third insulating film in a depth reaching said electrode pad, and a step of anisotropically etching said sensor substrate via said opening of the contact hole thereby forming a bridging part.

6. A method according to claim 5, wherein said semiconducting material is silicon.

7. A method according to claim 5, wherein said first, second, and third insulating films are made of at least one member selected from the group consisting of silicon oxynitride, silicon oxides, and silicon nitrides.

8. A method according to claim 5, wherein said infrared temperature-sensitive film is made of at least one member selected from the group consisting of amorphous germanium, amorphous silicon, polycrystalline silicon, and polycrystalline germanium.

9. A method for the production of an infrared sensor, comprising a step of forming a first insulating film on the obverse surface of a sensor substrate and then forming an infrared temperature-sensitive film on said insulating film, a step of forming a second insulating film in such a manner as to cover said infrared temperature-sensitive film, a step of forming on said second insulating film a first etchant-resistant film containing a prescribed contact hole pattern and etching said second insulating film with said first etchant-resistant film as a mask thereby forming in said second insulating film a contact hole so deep as to reach said infrared temperature-sensitive film, a step of superposing an electrically conductive layer on said second insulating film having said contact hole formed therein, and a step of forming on said electrically conductive layer a second etchant-resistant film containing an electrode pattern of a width greater than the width of said contact hole pattern in said first etchant-resistant film and etching said electrically conductive film with said second etchant-resistant film as a mask thereby forming an electrode.

10. A method according to claim 9, wherein said first and second insulating films are made of at least one member selected from the group consisting of silicon oxynitride, silicon oxides, and silicon nitrides.

11. A method according to claim 9, wherein said infrared temperature-sensitive film is made of at least one member selected from the group consisting of amorphous germanium, amorphous silicon, and polycrystalline silicon.

12. A method for the production of an infrared sensor comprising forming a first insulating film on a first surface of a sensor substrate made of a semiconducting material; forming a second insulating film containing an opening for etching on a second surface of said sensor substrate; forming an infrared temperature-sensitive film of amorphous germanium or amorphous silicon on said first insulating film to produce a plurality of sensor elements; forming an electrode pad on said infrared temperature-sensitive film, said electrode pad being electrically connected to said infrared temperature-sensitive film and having an etchant-resistant electrically conductive film on its uppermost layer; forming a third insulating film on said electrode pad; forming a contact hole in said third insulating film, said contact hole having a depth reaching said electrode pad; anisotropically etching said sensor substrate through said contact hole to form a bridging part; vacuum sealing said sensor elements each with a lid member capable of tightly sealing said sensor elements; and separating the vacuum sealed sensor elements asunder by cutting.

13. A method for the production of an infrared sensor comprising forming an infrared temperature-sensitive film of amorphous germanium or amorphous silicon on a semiconductor wafer having a bridging part to produce a plurality of sensor elements on said bridging part, vacuum sealing said sensor elements each with a lid member capable of tightly sealing said sensor elements, and separating the vacuum sealed sensor elements asunder by cutting.

* * * * *

UNITED STATES PATENT AND TRADEMARK OFFICE
CERTIFICATE OF CORRECTION

PATENT NO. : 5,521,123
DATED : May 28, 1996
INVENTOR(S) : Kiyoshi KOMATSU et al

It is certified that error appears in the above-indentified patent and that said Letters Patent is hereby corrected as shown below:

In Column 6, line 53, after "example" and before "experiment" insert -- of --.

In Column 6, line 56, delete "or" and insert -- of --.

In Column 8, line 41, delete "whale" and insert -- while --.

In Column 8, line 53, delete "methods" and insert -- method --.

In Column 9, line 37, delete "11$a$, 10$b$" and insert -- 11$a$, 11$b$ --.

In Column 10, line 39, delete "38$e$" and insert -- 38$c$ --.

In Column 12, line 36, after "technique" and before "vacuum" insert -- of --.

In Column 13, line 2, delete "Chemicallocy" and insert -- Chemicalloy --.

In Column 14, line 48, delete "was-formed" and insert -- was formed --.

In Column 15, line 65, delete "bolemeter" and insert -- bolometer --.

UNITED STATES PATENT AND TRADEMARK OFFICE
CERTIFICATE OF CORRECTION

PATENT NO. : 5,521,123
DATED : May 28, 1996
INVENTOR(S) : Kiyoshi Komatsu et al

It is certified that error appears in the above-indentified patent and that said Letters Patent is hereby corrected as shown below:

In Column 15, line 66, delete "bolemeter" and insert -- bolometer --.

In Column 16, line 33, delete "fop" and insert -- for --.

In Column 16, line 39, after "held", delete "sa".

In Column 17, line 30, delete "in a" and insert -- into --.

In Column 17, line 30, delete "Joined" and insert -- joined --.

In Column 17, line 31, delete "$10^5$" and insert -- $10^{-5}$ --.

In Column 20, line 35, after "film" and before ",", insert -- side and tightly sealing said laminate composite film --.

Signed and Sealed this

Seventh Day of January, 1997

Attest:

BRUCE LEHMAN

Attesting Officer     Commissioner of Patents and Trademarks